United States Patent
Gadbois et al.

(10) Patent No.: US 8,705,212 B2
(45) Date of Patent: Apr. 22, 2014

(54) MAGNETIC ELEMENT WITH ENHANCED COUPLING PORTION

(75) Inventors: Jason Bryce Gadbois, Shakopee, MN (US); Michael Christopher Kautzky, Eagan, MN (US); Mark William Covington, Edina, MN (US); Dian Song, Eden Prairie, MN (US); Dimitar Velikov Dimitrov, Edina, MN (US); Qing He, Plymouth, MN (US); Wei Tian, Eden Prairie, MN (US); Thomas Boonstra, Chaska, MN (US); Sunita Gangopadhyay, Eden Prairie, MN (US)

(73) Assignee: Seagate Technology LLC, Scotts Valley, CA (US)

(*) Notice: Subject to any disclaimer, the term of this patent is extended or adjusted under 35 U.S.C. 154(b) by 108 days.

(21) Appl. No.: 13/093,536

(22) Filed: Apr. 25, 2011

(65) Prior Publication Data

US 2012/0268846 A1 Oct. 25, 2012

(51) Int. Cl.
*G11B 5/33* (2006.01)
*H01L 29/82* (2006.01)

(52) U.S. Cl.
USPC .............. 360/313; 360/324.12; 29/603.08; 257/421

(58) Field of Classification Search
CPC .... G11B 5/3909; G11B 5/3932; G11B 5/398; G11B 5/39; G11B 5/3903; G11B 5/313; H01F 10/3254; H01F 10/3272; H01F 10/3268; H01F 10/3263
See application file for complete search history.

(56) References Cited

U.S. PATENT DOCUMENTS

| | | | |
|---|---|---|---|
| 5,576,914 A | 11/1996 | Rottmayer et al. | |
| 5,726,841 A | 3/1998 | Tong et al. | |
| 5,764,567 A | 6/1998 | Parkin | |
| 5,978,184 A | 11/1999 | Terunuma | |
| 6,233,172 B1 | 5/2001 | Chen et al. | |
| 6,340,886 B1* | 1/2002 | Daughton et al. | 324/252 |
| 6,376,260 B1* | 4/2002 | Chen et al. | 438/3 |
| 6,795,280 B1 | 9/2004 | Song et al. | |
| 7,016,160 B2* | 3/2006 | Mao et al. | 360/314 |
| 7,035,062 B1 | 4/2006 | Mao et al. | |
| 7,054,119 B2* | 5/2006 | Sharma et al. | 360/324.2 |
| 7,126,201 B2* | 10/2006 | Matsutera et al. | 257/421 |
| 7,132,175 B2* | 11/2006 | Hasegawa et al. | 428/811.2 |
| 7,324,313 B2* | 1/2008 | Childress et al. | 360/324.12 |
| 7,390,584 B2* | 6/2008 | Daughton et al. | 428/811.2 |
| 7,663,848 B1* | 2/2010 | Huai et al. | 360/324.2 |
| 8,059,374 B2* | 11/2011 | Zhao et al. | 360/324.2 |
| 8,254,067 B2* | 8/2012 | Nishioka et al. | 360/324.2 |

(Continued)

OTHER PUBLICATIONS

Aram Amassian, Kate Kaminska, Motofumi Suzuki, Ludvik Martinu and Kevin Robbie, "Onset of shadowing-dominated growth in glancing angle deposition," Applied Physics Letters 91, 2007, pp. 1-3, American Institute of Physics.

(Continued)

*Primary Examiner* — Brian Miller
(74) *Attorney, Agent, or Firm* — Hall Estill Attorneys at Law

(57) ABSTRACT

An apparatus and associated method may be used to produce a magnetic element capable of detecting changes in magnetic states. Various embodiments of the present invention are generally directed to a magnetically responsive lamination of layers with a first portion and a laterally adjacent second portion. The second portion having a predetermined roughness between at least two layers capable of producing orange-peel coupling.

26 Claims, 7 Drawing Sheets

(56) References Cited

U.S. PATENT DOCUMENTS

| | | | |
|---|---|---|---|
| 8,259,420 B2* | 9/2012 | Zhao et al. | 360/324.12 |
| 2002/0154455 A1 | 10/2002 | Lenssen | |
| 2004/0012895 A1 | 1/2004 | Drewes et al. | |
| 2004/0013880 A1 | 1/2004 | Daughton et al. | |
| 2005/0111147 A1* | 5/2005 | Hiramoto et al. | 360/324.11 |
| 2008/0008909 A1* | 1/2008 | Fuji et al. | 428/811.3 |
| 2008/0247072 A1* | 10/2008 | Nozieres et al. | 360/59 |
| 2012/0038012 A1* | 2/2012 | Zhao et al. | 257/421 |

OTHER PUBLICATIONS

J. Dufourcq, G. Gay, D. Lafond, P. Mur, G. Molas, J. P. Nieto, L. Vandroux, L. Jodin, F. Gustavo and TH. Baron, "High density platinum nanocrystals for non-volatile memory applications," Applied Physics Letters 92, 2008, pp. 1-3, American Institute of Physics.

Damon B. Farmer and Roy G. Gordon, "High density Ru nanocrystal deposition for nonvolatile memory applications," Journal of Applied Physics 101, 2007, pp. 1-5, American Institute of Physics.

Ralf Hofmann and Nety Krishna, "Self-assembled metallic nanocrystal structures for advanced non-volatile memory applications," Microelectronic Engineering 85, 2008, pp. 1975-1978, Elsevier B. V.

Zengtao Liu, Venkat Narayanan, Gen Pei and Edwin Chihchuan Kan, "Metal Nanocrystal Memories—Part I: Device Design and Fabrication," IEEE Transactions on Electron Devices, Sep. 2002, vol. 49, No. 9, pp. 1606-1613, IEEE.

U. Valbusa, C. Boragno and F. Buatier de Mongeot, "Nanostructuring surfaces by ion sputtering," Journal of Physics Condensed Matter 14, 2002, pp. 8153-8175, IOP Publishing Ltd., UK.

Sung-Soo Yim, Do-Joong Lee, Ki-Su Kim, Moon-Sang Lee, Soo-Hyun Kim and Ki-Bum Kim, "Atomic Layer Deposition of Ru Nanocrystals with a Tunable Density and Size for Charge Storage Memory Device Application," Electrochemical and Solid-State Letters 11, 2008, pp. K89-K92, The Electrochemical Society.

* cited by examiner

MAGNETIC ELEMENT WITH ENHANCED COUPLING PORTION

SUMMARY

Various embodiments of the present invention are generally directed to a memory element capable of detecting changes in magnetic states.

In accordance with various embodiments, a magnetically responsive lamination of layers has a first portion and a laterally adjacent second portion. The second portion has a predetermined roughness between at least two layers capable of producing orange-peel coupling.

DETAILED DESCRIPTION

The present disclosure generally relates to a magnetic element capable of detecting magnetic fluctuations. As electronics devices become more sophisticated, demand for higher data capacity and improved data transfer rates have placed added emphasis on the speed and reliability of data sensing elements. With a large segment of data storage being conducted through the use of magnetic storage, magnetic stabilization of the data sensing elements that are sensitive to changes in magnetic fluctuations plays an ever important role.

Accordingly, a magnetic element can have an increased magnetic stabilization with enhanced ferromagnetic coupling in a portion of the element through the creation of orange-peel coupling. By creating a predetermined roughness between some or all of the layers in a rear portion of the magnetic element, orange-peel coupling can be generated in the rear that improves magnetic stabilization of the element while maintaining a magnetic magnitude of interaction at a front portion of the element.

The orange-peel coupling can further be accompanied by continuously tapering each layer of the magnetic element throughout the rear portion. As a result of the enhanced ferromagnetic coupling in the rear of the rear of the element, non-magnetic spacer layer that separates the magnetic free layers in the element can be reduced which in turn increases the resolution of the magnetic element due to reduced shield-to-shield spacing. Thus, a magnetic element can have an improved magnetic stabilization combined with the capability of reading data from smaller and smaller portions of a data storage media.

Figure 1:
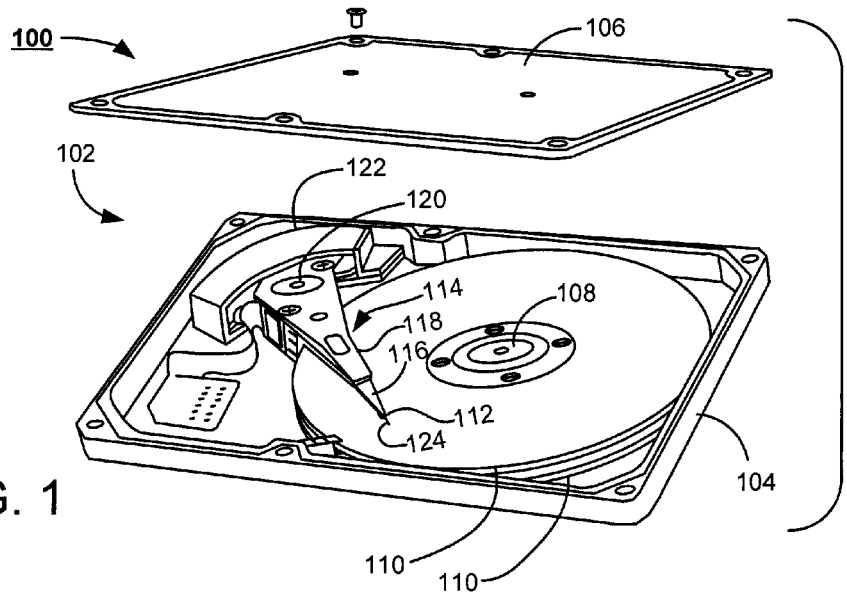
FIG. 1 is a perspective view of an example of a data storage device.

An example of a data storage device 100 that is capable of utilizing such a magnetic element is provided in FIG. 1. The device 100 is provided to show a non-limiting environment in which various embodiments of the present invention can be practiced. The device 100 includes a substantially sealed housing 102 formed from a base deck 104 and top cover 106. An internally disposed spindle motor 108 is configured to rotate a number of storage media 110. The media 110 is accessed by a corresponding array of data transducers that are each supported by a head gimbal assembly (HGA) 112. Each HGA 112 can be supported by a head-stack assembly 114 ("actuator") that includes a flexible suspension 116, which in turn is supported by a rigid actuator arm 118. The actuator 114 may pivot about a cartridge bearing assembly 120 through application of current to a voice coil motor (VCM) 122.

In this way, controlled operation of the VCM 122 causes the transducers 124 of the HGA 112 to align with tracks (not shown) defined on the media surfaces to store data thereto or retrieve data therefrom. An ability to decrease the width of the tracks while maintaining proper alignment of the transducers 124 can be accomplished by decreasing the operational width of at least one transducing magnetic element. Thus, the device 100 can have increased capacity through the incorporation of transducing elements with reduced operational width which corresponds to a finer areal resolution.

Figure 2:
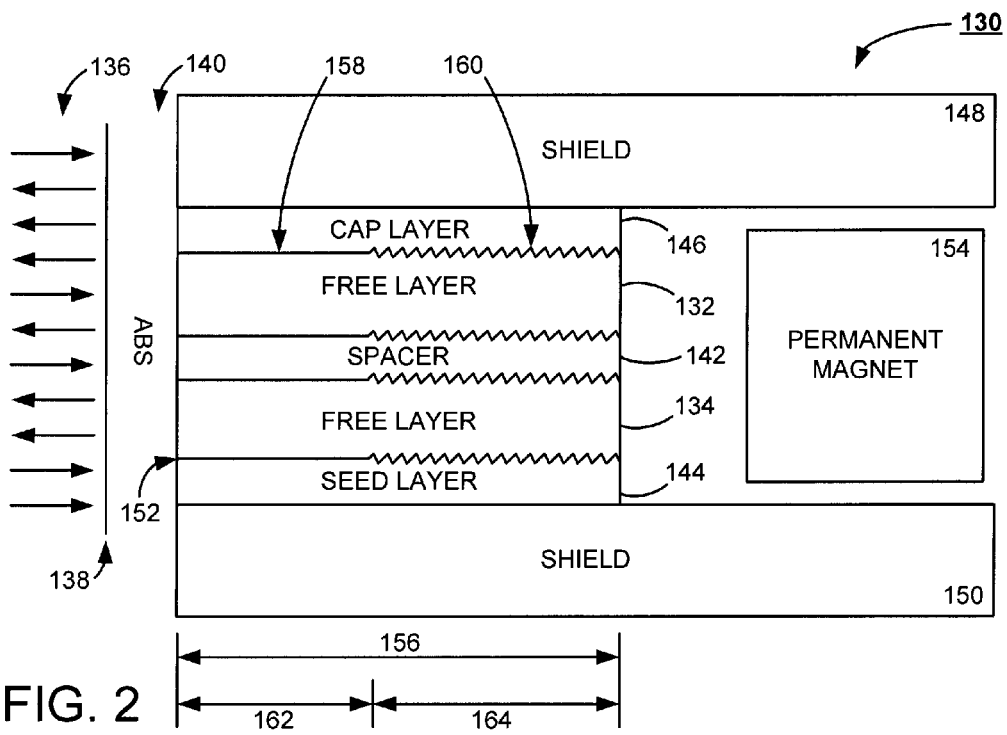
FIG. 2 generally illustrates an embodiment of a magnetic element capable of being used in the data storage device of FIG. 1.

FIG. 2 displays a cross-section view of block representation of an embodiment of a magnetic element 130 capable of being used in the device 100 of FIG. 1. The element 130 can be constructed with first and second ferromagnetic free layers 132 and 134 that are each sensitive to external magnetic fields. That is, each free layer 132 and 134 can have independent or common magnetizations that correspond to an encountered external magnetic field, such as programmed magnetic bits 136 on a data storage media 138 separated from the free layers 132 and 134 by an air bearing surface (ABS) 140.

In some embodiments, the free layers 132 and 134 can be separated by a non-magnetic spacer layer 142 that can be constructed with a variety of thicknesses to accommodate free layer magnetic sensing. The free layers 132 and 134 can each further be coupled to a respective electrode layer, such as seed layer 144 and cap layer 146. The composition, shape, and placement of the electrode layers are not limited and can be modified without deterring from the spirit of the present invention.

The magnetic element 130 can also be constructed with a shield layer attached to the electrode layers on opposite sides of the free layers 132 and 134. The shield layers 148 and 150 can be oriented in a variety of formations and compositions to direct unwanted magnetic flux away from the free layers 132 and 134. Such shielding can allow for improved magnetic sensing of programmed bits 136 from media 138 by eliminating noise and inadvertent sensing of adjacent bits. The downtrack magnetic resolution is inversely proportional to the distance between the shield layers 148 and 150, also known as shield-to-shield spacing, which corresponds with increased storage capacity as the spacing decreases.

Operationally, the free layer 132 and 134 in combination with the spacer 140 form a magnetic sensing stack 152 that is influenced with a bias magnetic force from a permanent magnet 154 positioned laterally adjacent the magnetic stack 152 opposite the ABS 140. The magnetic stack 152 can further be configured with an elongated stripe height 156 that corresponds with increased performance with robustness against process variability and external disturbances. Such increased performance can allow for improved magnetic sensing of external bits, such as bits 136. However, the improved robustness against process variability can be associated with introducing an undesirable magnetic instability in some devices during manufacturing. This particular instability mode is related to a situation where the magnetic layers 132 and 134 assume magnetization configurations which are largely antiparallel to each other.

In an effort to solve such unwanted magnetization configuration, various embodiments of the present invention partition one or more layers of the magnetic stack 152 into first and second portions 158 and 160 that have lengths 162 and 164, respectively. It should be noted that the shape and location of the portions 158 and 160 are not limited and can be present on merely the surfaces of each layer that contacts another layer or extend throughout each layer of the stack 152. While the lengths 162 and 164 of the portions 158 and 160 can configured to be equal, various configurations are possible in which the lengths of portions of particular layers are different from the other portions. For example, the length of the second portion positioned between the free layer 132 and spacer 142 could be different from the length 164 of the second portion between the free layer 132 and the cap layer 146. In other words, the ratio of the length 162 of the first portion 158 to the length 164 of the second portion 160 can be equal or varied between each layer of the stack 152.

In various embodiments, the second portion 160 has a surface roughness that differs from the first portion 158. As shown in FIG. 2, the surfaces between each layer of the stack 152 in the second portion 160 are roughened compared to the corresponding surfaces of the first portion 158. Such increase in roughness can generate larger Neel coupling (or "orange-peel coupling") characteristics that increase ferromagnetic coupling between the layers of the stack 152. Consequently, the ferromagnetic coupling experienced by the stack 152 can be adjusted by varying the degree of roughness in the second portion 160.

The presence of the enhanced ferromagnetic coupling due to the increased roughness and corresponding orange-peel coupling operates in concert with the permanent magnet 154 to influence the magnetic orientation of the free layers 132 and 134 to provide a default magnetic reference. That is, the orange-peel coupling adds to the bias magnetic force imparted by the permanent magnet 154 to maintain one or both of the free layers 132 and 134 in a predetermined magnetic orientation that can be overcome in the presence of an external magnetization above a predetermined threshold.

It should be noted that the magnetization directions and magnitudes of the permanent magnet 154, orange-peel coupling, and free layers 132 and 134 are not limited and can be configured as needed for a predetermined performance of the magnetic element 130.

Figure 3:
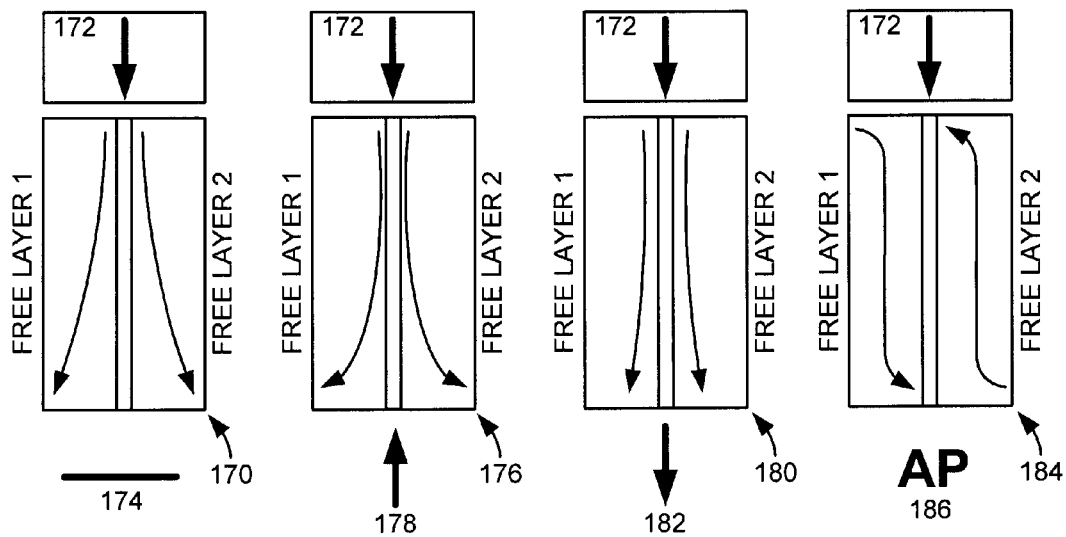
FIG. 3 shows a portion of the magnetic element of FIG. 2 as constructed and operated in accordance with various embodiments of the present invention.

FIG. 3 generally illustrates a number of magnetic stacks in response to a variety of external magnetizations with the use of a rearward magnet and without the use of increased roughness to generate orange-peel coupling. Stack 170 displays the first and second free layers with a default magnetic orientation set by the bias magnetization from the magnet 172. The magnetically neutral external field 174 does not influence the default magnetization of the stack 170 as the magnetizations of each free layer cant towards the corners in order to minimize the magneto static interaction energy.

When the free layers encounter an external magnetization in a first upward direction, as shown by stack 176 and magnetization 178, the magnetization of the free layers further cant towards the corners in a manner that is proportional to the strength of the field produced by the external magnetization and through the use of thresholds and encoding schemes can be sensed to correspond to a logical state, such as 0 or 1. The respective strengths of the different biases applied to the free layers can also be designed to cause the device to operate in a digital mode flipping between two discrete states in the presence of external fields such as those produced by a storage medium. It should be noted that the distance between the free layers can further affect the magnetization characteristics of the stacks and so the operations shown in FIG. 3 are not required or limited.

In magnetic stack 180, an external magnetization 182 of a second downward direction and above the default magnetization of the magnet 172 affects the magnetization of the free layers. The free layer magnetizations decrease the cant towards the corners and become more parallel as the external magnetization 182 matches the direction of the bias field from the magnet 172. As with the free layer magnetizations of stack 176, the affect of external magnetization 182 can be sensed and differentiated from the default magnetization of stack 172 to read a logical state.

While operation of the dual free layer stacks 170, 176, and 180 can be sensed by a variety of different manners, such as, but not limited to, tunneling magneto resistive (TMR) and giant magneto resistive (GMR) effects depending on the configuration of the spacer layer between the free layers, magnetic instability can occur when one of the free layers inadvertently switches magnetization direction, as shown in stack 184. Such a switch in magnetization can be referred to as an AP state 186 in which high resistance and very small output response makes it unsuitable to read external data bits.

A switch to an AP state 186 can occur in response to various characteristics like heat and relatively strong external fields and can result in catastrophic failure of a data transducing head. As such, the generation of orange-peel coupling with increased roughness in portions of the magnetic stack, as displayed of FIG. 2, can enhance ferromagnetic coupling and stabilize the magnetization of the free layers while not adversely adding thickness to the magnetic stack.

Furthermore, by increasing the roughness of portions of the magnetic stack that are opposite the external bits and ABS, the enhanced ferromagnetic coupling does not affect the magnetic response of the free layers at the ABS. As such, normal magnetic sensing magnitudes, margins, and interactions are experienced at the ABS which corresponds to the ability to consistently read external bits and produce reliable data sensing.

The placement of the increased roughness along the top surface of each of the layers in the stack further allows for the orange-peel coupling to be perpendicular to the ABS, in contrast to the permanent magnet oriented to the rear of the free layers. Consequently, the configuration of the magnetic stack to generate orange-peel coupling between one or more layers in a portion of the stack opposite the ABS can result in the free layers returning to the default magnetization despite thermal or magnetic excitations.

Figure 4:
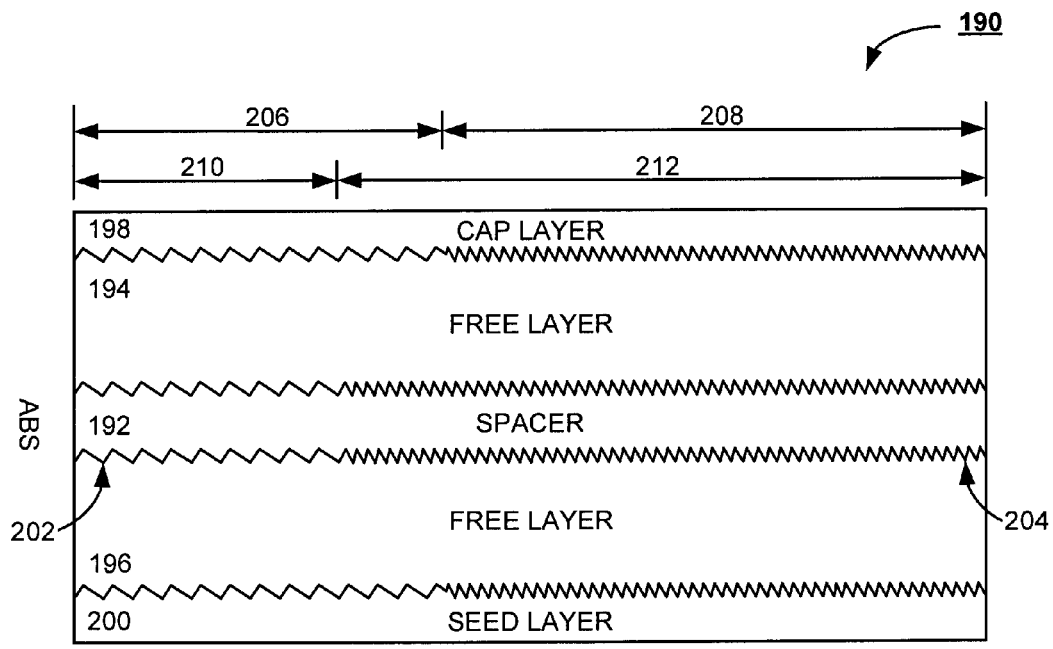
FIG. 4 displays an example of operational characteristics of the magnetic element of FIG. 2.

An example of a magnetic element configuration is displayed with the magnetic stack 190 of FIG. 4. A spacer layer 192 separates a first and second free layer 194 and 196 that are each attached a cap layer 198 and seed layer 200, respectively. The stack 190 is divided into a first portion 202 that is contactingly adjacent to the ABS while a second portion 204 is positioned at the back of each layer opposite the ABS. In various embodiments, the second portion 204 is completely isolated from the ABS surface so as not to produce unwanted magnetic characteristics.

While the first portion 202 of the stack 190 can be significantly smooth, such as in FIG. 2, the first portion 202 can alternatively have a degree of roughness that generates orange-peel coupling. The enhanced ferromagnetic coupling that results from the increased roughness can further be present in the second portion 204 to a degree that is greater than the roughness of the first portion 202. As such, the orange-peel coupling in the second portion 204 will be greater than the coupling in the first portion 202, thereby preserving the operational ratio of coupling between the portions 202 and 204 found in FIG. 2.

The magnetic stack 190 can further be configured with a second portion 204 that varies in length with respect to the first portion 202. As shown, the interface surface between the cap layer 198 and the free layer 194 has a first portion length 206 and a second portion length 208 that make up a first predetermined portion ratio. Meanwhile, the interface surface between the free layers 194 and 196 and the spacer 192 are each oriented with first and second portion lengths 210 and 212 that each differ from lengths 206 and 208 and make up a second predetermined portion ratio. With such a configuration, orange-peel coupling can be further enhanced between the free layers 194 and 196 while maintaining an operational distance from the ABS.

Figure 5:
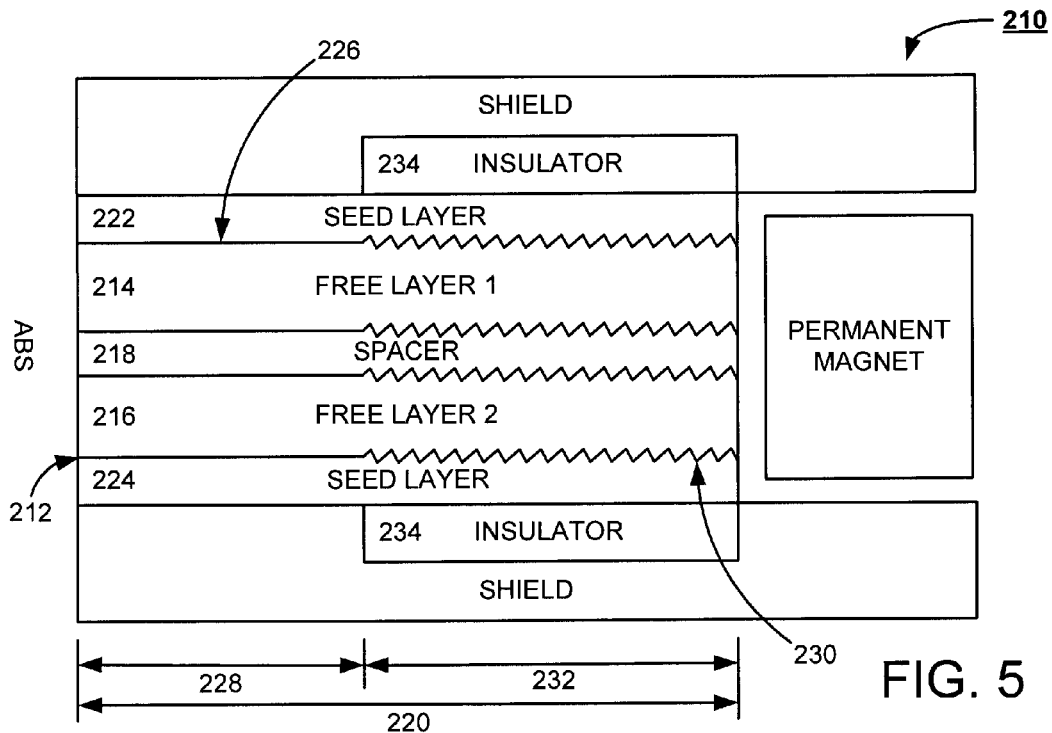
FIG. 5 shows a magnetic element constructed and operated in accordance with various embodiments of the present invention.

FIG. 5 provides a magnetic element 210 constructed and operated in accordance with various embodiments of the present invention. The element has a magnetic stack 212 that comprises first and second free layers 214 and 216 that are separated by a non-magnetic spacer 218 and each having a predetermined stripe height 220. The free layers 214 and 216 are further each attached to a respective electrode layer having the same stripe height 220, such as cap layer 222 and seed layer 224, which can be constructed of various material including, but not limited to Tantalum.

The magnetic stack 212 is divided into a first portion 226 that has a first length 228 and is characterized by significantly smooth interface surfaces between each layer and a second portion 230 that has a second length 232 and is characterized by roughened interface surfaces directed to generate orange-peel coupling. However, it has been observed that electrical shorts can occur in the second portion 230 due to the increased roughness, especially when the amplitude of the roughness is approximately the same as the thickness of the non-magnetic spacer 218.

Accordingly, an insulating material 234 can be deposited between the stack 212 and one or both shields 236 and 238 to quell the effect of electrical shorts. In some embodiments, the insulating material 234 can have a substantially smooth interface surface between with either, or both, the electrode layers. In other embodiments, the stack 212 is further insulated by in positioning the insulating material to contactingly engage both the first and second portions 226 and 230.

In some applications, the addition of orange-peel coupling does not provide enough ferromagnetic coupling. Such situations can be addressed and overcome with the magnetic element 240 of FIG. 6. The element 240 has a magnetic stack 242 that has dual free layers 244 separated by a non-magnetic spacer 246 and each attached to electrode layers, such as seed 248 and first cap 250.

Ferromagnetic coupling of the stack 242 is initially enhanced by the roughening of the interface surfaces between each of the layers in the stack 242 throughout a second portion 252. The inclusion of an antiferromagnetic AFM layer 254 to one, or both, of the free layers 244 adds another bias to one or both of the free layers to compliment the bias produced by the orange-peel coupling and the permanent magnet bias.

Figure 6:
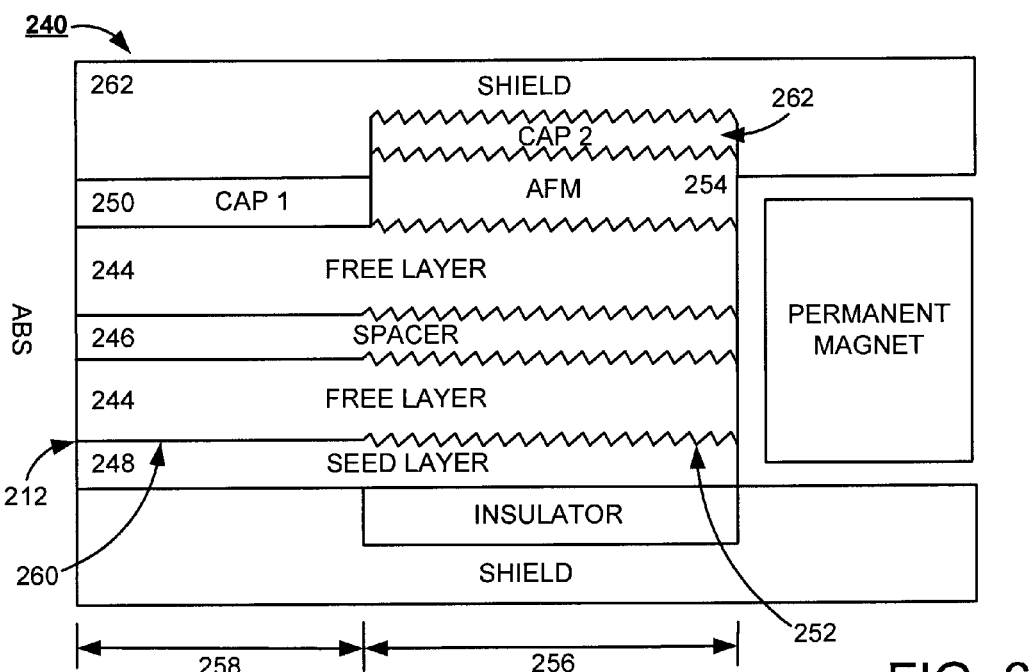
FIG. 6 provides a magnetic element constructed and operated in accordance with various embodiments of the present invention.

The addition of the AFM layer 254 can produce exchange bias fields that enhance the magnetic stability of the second portion 252. As shown in FIG. 6, the AFM layer 254 extends throughout the length 256 of the second portion 252 without encroaching any part of the length 258 of the first portion 260. Such AFM layer 254 configuration allows for normal magnetic interactions and sensing of external bits at the ABS.

Inclusion of the AFM layer 254 can also orient a second cap layer 262 that extends throughout the length 256 second portion 252 offset from the first cap layer 250. That is, the second cap layer 262 is contactingly adjacent the AFM layer 254 and is housed in a recess of the shield layer 262. While a single AFM layer 254 can compliment the orange-peel coupling to provide enhanced magnetic stability, the various embodiments of the present invention are not limited to a single AFM layer. For example, several AFM layers could be positioned throughout the second portion 252 of the stack 242 to further increase magnetic stability.

Figure 7A:
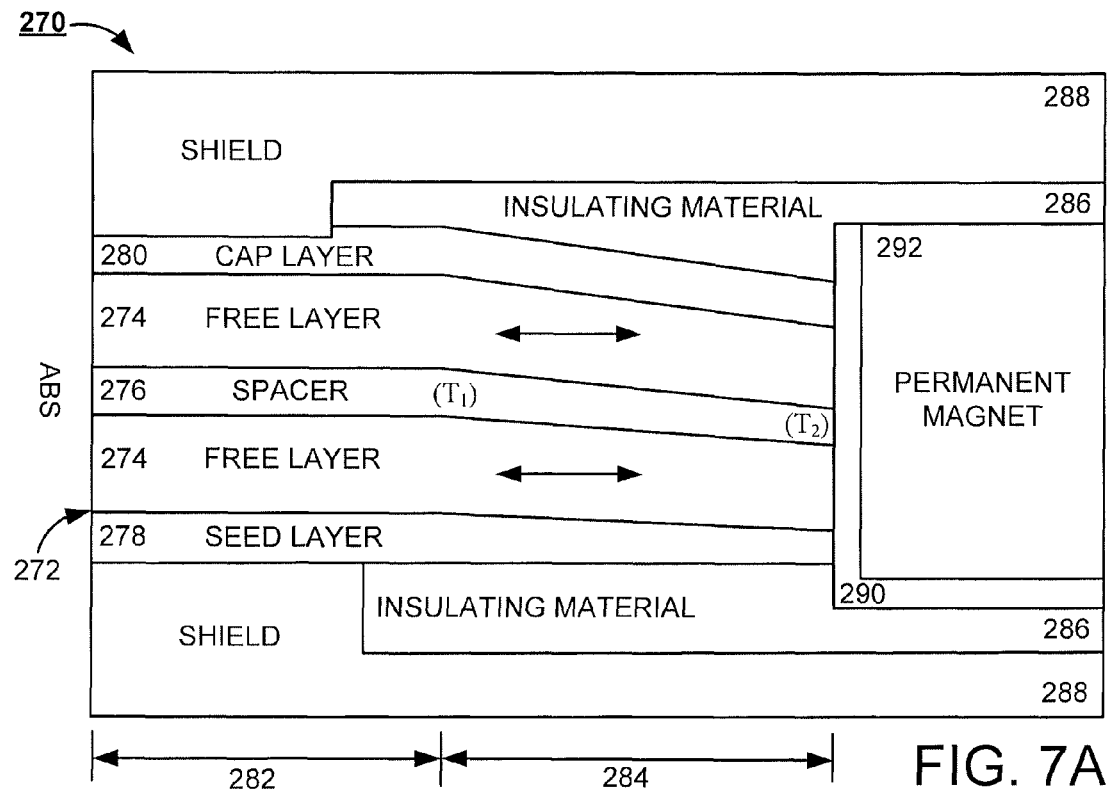
FIGS. 7A and 7B show magnetic elements constructed and operated in accordance with various embodiments of the present invention.
Figure 7B:
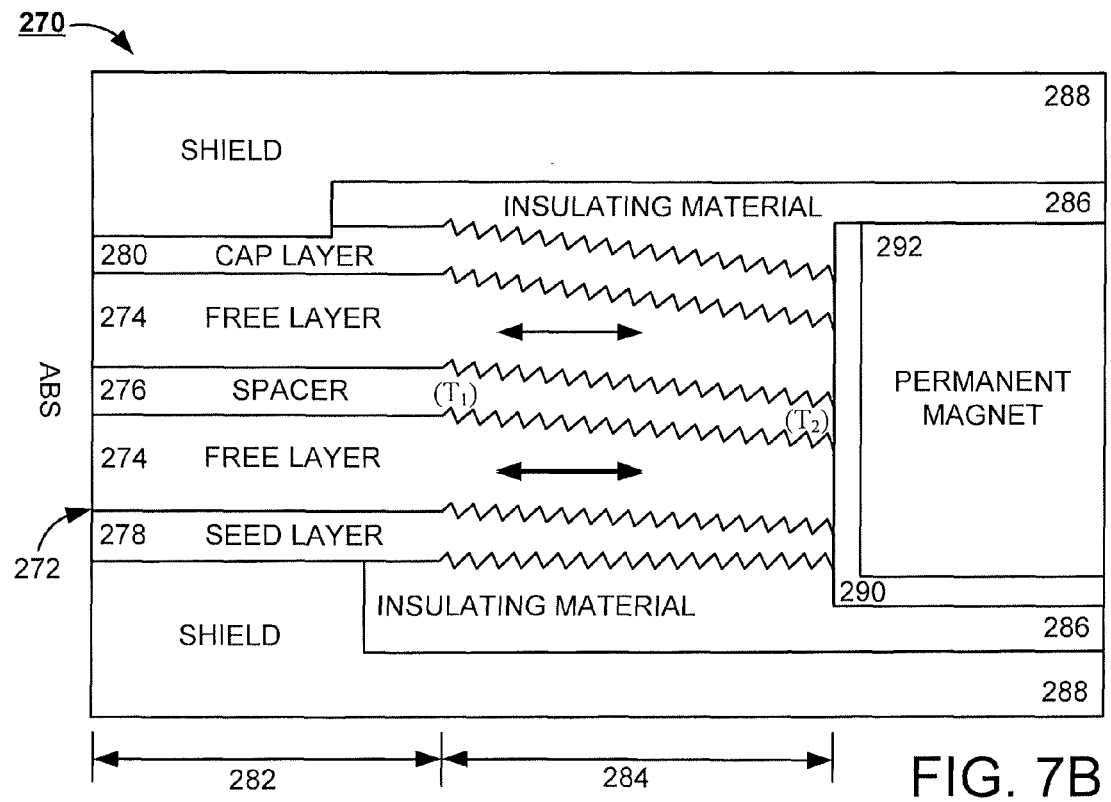

FIGS. 7A and 7B display another example of a magnetic element 270 which has a magnetic stack 272 that has multiple free layers 274 separated by a non-magnetic spacer layer 276 and attached to first and second electrodes layers 278 and 280. The stack 272 further is divided into first and second portions 282 and 284 that, like the portions of FIGS. 2 and 4-6, have predetermined lengths oriented either contactingly adjacent the ABS or opposite the ABS.

The second portion 284 of the stack 272 can be oriented to continuously taper from a first thickness ($T_1$) to a reduced second thickness ($T_2$). Such tapered configuration can enhance ferromagnetic coupling in the stack 272 by reducing the thickness of the non-magnetic spacer layer 276 which corresponds with increased magnetic interaction between the free layers 274. By reducing the thickness of the spacer 276 on the back part of the stack 272 opposite the ABS, the normal operational characteristics of the free layers 274 at the ABS are preserved.

The stack 272 is insulated with insulating material 286 that aids in preventing electrical shorts from the second portion 284. As displayed in FIG. 7A, each shield 288 has a region of reduced thickness to accommodate a predetermined thickness of the insulating material 286 without increasing the shield-to-shield spacing of the element 270. The rear of the stack 272 is further insulated by a material 290 that may be the same as, or different from, the insulating material 286. In some embodiments, the material 290 is thinly deposited about a permanent magnet 292 mounted a predetermined distance behind the stack 272.

The magnetic stack 272 configuration of FIG. 7A with increased ferromagnetic coupling can further be enhanced by roughening the interface surfaces between the layers throughout the second portion to generate enhanced orange-peel coupling, as shown in FIG. 7B. That is, the tapered second portion of each layer of the stack 272 can be oriented with continuous regions of roughness that generate enhanced orange-peel coupling and strengthen the ferromagnetic coupling of the second portion 284 and the stack 272.

It should be noted that the free layers 274 may be further influenced by a bias magnetization from the permanent magnet 292 positioned opposite the free layers from the ABS. However, the position of the magnet 292 can be less magnetically efficient than that of the reduced thickness of the non-magnetic spacer 276 of FIG. 7A and the orange-peel coupling of FIG. 7B due to the relatively small surface area of each of the free layers 274 facing the magnet 182 on the back surface of the stack 272.

Figure 8:
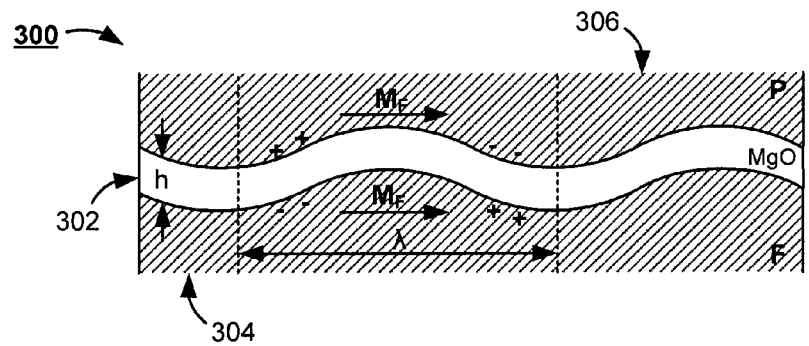
FIG. 8 shows an example of operational characteristics of the magnetic element of FIG. 2.

FIGS. 8-12C each provide element fabrication processes conducted in accordance with various embodiments of the present invention. In FIG. 8, a Neel model 300 of magnetic films with infinite thickness is provided to show the increased ferromagnetic coupling of orange-peel coupling. A roughness layer 302 is constructed of a roughness material, such as MgO, that has a thickness (h) and a wavelength of λ which enhances ferromagnetic coupling between first and second magnetic free layers 304 and 306. The ferromagnetic coupling can be modeled further by equation 1:

$$H_1 = \frac{\pi^2 h^2 M_s}{\sqrt{2}\lambda t_{FL}}\left[1 - \exp\left(\frac{-2\pi\sqrt{2}\, t_{FL}}{\lambda}\right)\right]\left[1 - \exp\left(\frac{-2\pi\sqrt{2}\, t_{PL}}{\lambda}\right)\right] \exp\left(\frac{-2\pi\sqrt{2}\, t_{MgO}}{\lambda}\right) \quad (1)$$

where $t_{FL}$, $t_{PL}$, and $t_{MgO}$ are the thicknesses of the various layers 302, 304 and 306, respectively.

Figure 9:
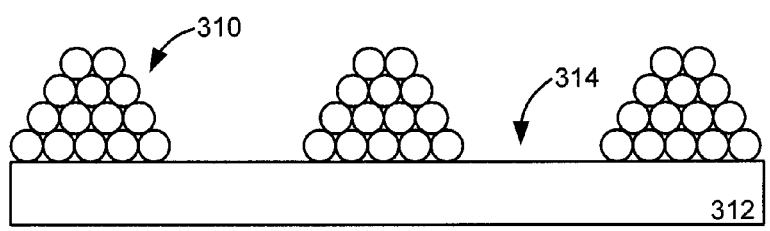
FIG. 9 illustrates an example of a fabrication technique that can be utilized during manufacturing of the magnetic element of FIG. 2.

FIG. 9 displays another embodiment of a fabrication technique in which islands 310 are grown on a substrate 312. The islands can be grown under various conditions and can conform to a variety of patterns, shapes, sizes, and materials. A non-limiting embodiment of an island growth process is a Volmer-Weber growth in which film atoms are more strongly bound to each other than to the substrate 312. The Volmer-Weber growth also provides zero miscibility between the islands and the substrate 312 which allows for a predetermined gap 314 between the islands and the capability of growing the islands in a predetermined pattern.

Furthermore, the Volmer-Weber growth provides slow diffusion and high surface energy islands on the low surface energy substrate 312 which allows uniform growth of the islands across the substrate 312, as shown in FIGS. 2 and 4-6. In various embodiments, the island growth shown in FIG. 8 uses Ru, Pt, Pd, and Au on oxides, high surface energy metals on Au or Cu, and Ru on NiFe, but such various configurations are not limited or required.

Island growth can also take the form of nano-crystals that are formed and activated by de-wetting. That is, nano-crystals are deposited on a high surface energy metal and subsequently annealed for agglomeration. Such process relaxes the stresses in the formed nano-crystals with the added benefit of limited diffusion. Nano-crystals on the order of 2-5 nm and can have an areal density of $1\times10^{11}$ to $7\times10^{12}$, but such configuration is merely illustrative and does not limit the potential use of the de-wetted nano-crystals.

Figure 10:
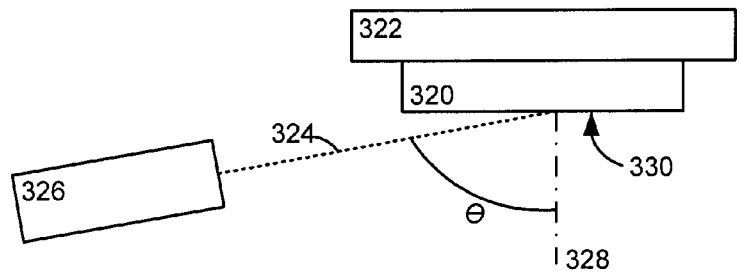
FIG. 10 shows an example of a fabrication technique that can be utilized during the manufacturing of the magnetic element of FIG. 2.

FIG. 10 displays another example of a fabrication technique in which material 320 is deposited onto a substrate 322 at a high angle of attack 324. That is, material 320 is deposited from a deposition source 326 to the substrate 322 with an angle (θ) which is large with respect to an axis 328 normal to the destination surface 330 of the substrate 322. Such high angle of attack 324 can allow for the uniform build-up of roughness on the destination surface 330 of the substrate 322.

While the deposition of material at the high angle of attack 324 can produce roughness, ion beam etching, or taking away of material, at such high angle can generate roughness in the substrate 322 and on any deposited material. It has been observed that erosion of solid surfaces, such as material deposited on the substrate 322, at oblique incidences, such as the high angle of attack 324, can lead to periodic ripple patterns capable of producing orange-peel coupling in accordance with the Neel modeling of FIG. 8.

Figure 11A:
FIGS. 11A-11C display an example of a fabrication technique that can be utilized during the manufacturing of the magnetic element of FIG. 2.
Figure 11B:
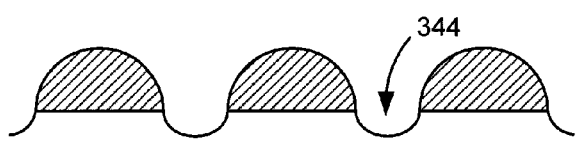
Figure 11C:
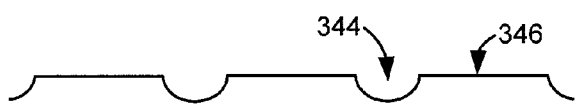

FIGS. 11A-11C illustrate an island etching fabrication process in which nano-crystals 340 are formed in a predetermined pattern on a substrate 342. The substrate is subsequently etched to produce localized reduced areas of thickness 344 between the nano-crystals 340, as shown in FIG. 11B. While the nano-crystals 340 can remain attached to the substrate 342 to further roughen the surface of the substrate, the crystals may alternatively be removed through various processes, such as polishing, to leave the etched reduced areas of thickness 344 between separated portions 346 of the substrate surface.

It should be noted that none of the processes shown in FIGS. 9-11C are exclusive or limited and can be used, partially or wholly, in combination with one another to produce a predetermined roughened surface that is capable of generating orange-peel coupling in accordance with FIG. 8. The materials, shapes, and orientations of the roughened surfaces can be deposited onto and removed from the underlying substrate to produce a patterned roughness that extends both below and above the surface of the substrate.

Figure 12A:
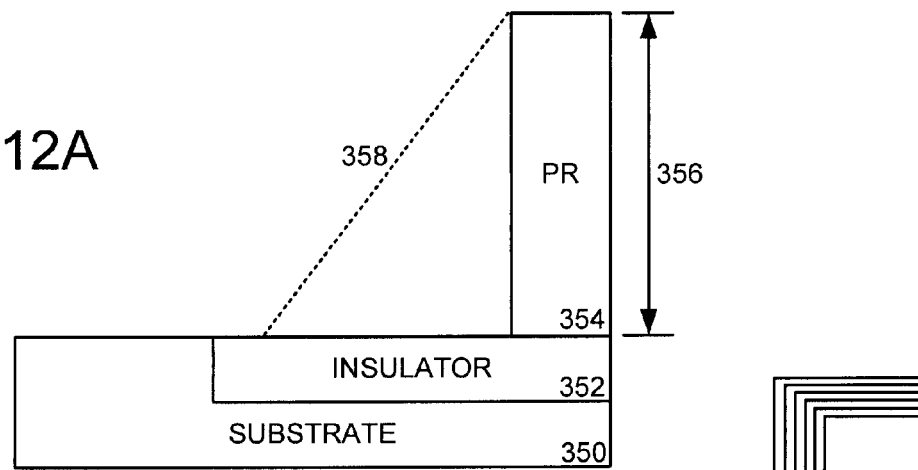
FIGS. 12A-12C provide an example of a fabrication of the magnetic element of FIG. 7.
Figure 12B:
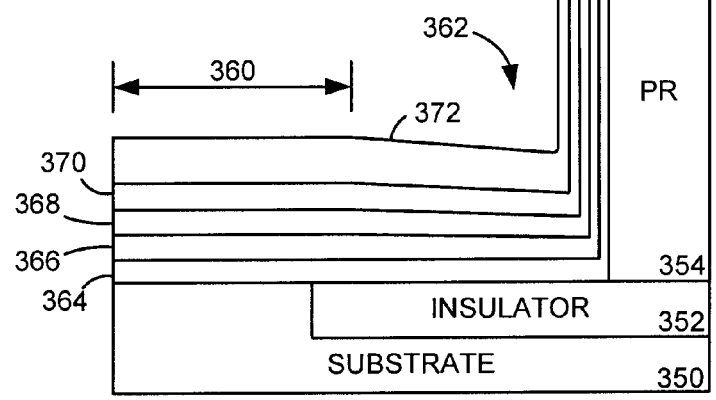
Figure 12C:
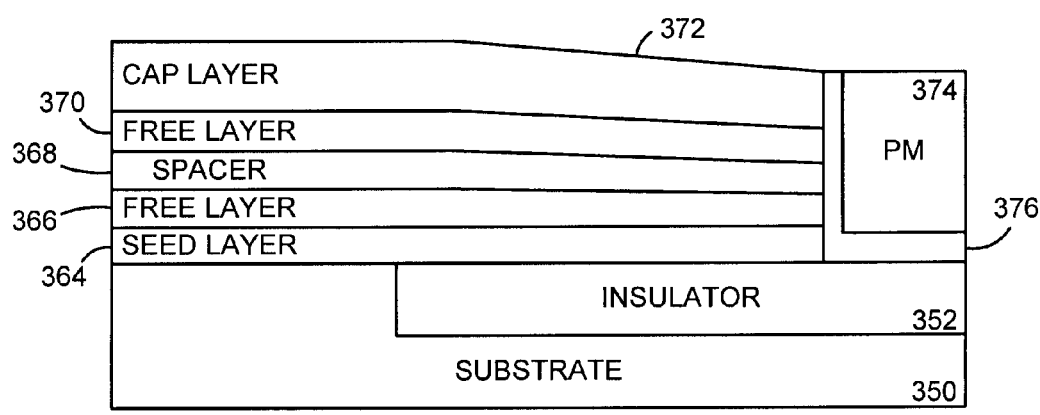

FIGS. 12A-12C generally illustrate another fabrication process in which a portion of the lamination of layers 350 is continuously tapered. Initially, a substrate 350 is deposited with an insulating material 352 that extends along some, or all, of the underlying substrate 350. The insulating material 352 is subsequently deposited with a photo resist (PR) material 354 which extends a predetermined height 356 above the insulating material 352.

In some embodiments, the height 356 of the PR material, such as a height that is greater than the stripe height of the lamination of layers 350, is selected to provide a particular shadow 358 onto the insulating material 352 and substrate 350. As subsequent layers are deposited onto the substrate 350 and insulating material 352, the PR material 394 prevents material from being deposited at thickly under the shadow 358 region. That is, the shadow 358 cast by the height 356 of the PR material 354 shields the deposition of some material onto the insulating material 352 under the shadow region 358. As a result, each of the deposited layers have a first portion 360 with a uniform thickness and a tapered portion 362 that lies under the shadow 358 and continuously tapers to a thickness that is less than the thickness the respective layer had in the first portion 360, as shown in FIG. 12B.

Further in the embodiment of FIG. 12B, a seed layer 364 is deposited onto the substrate 350, insulating material 352, and over the PR material 354 that has a relatively small tapered reduction in thickness. Such small tapered reduction can be facilitated in a number of ways, none of which are required or limited, such as the deposition of a majority of the seed material from the shadow 358 side of the PR material 354. Similarly, a magnetic free layer 366 can be deposited onto the seed layer 364 and be configured with a relatively large or small tapered reduction in thickness.

Subsequently, a non-magnetic spacer layer 368 is deposited on the free layer 366 and has a large tapered reduction in thickness that can be due to deposition of the material from the side of the PR material 354 opposite the shadow 358.

Thus, the PR material 354 shields the spacer layer material from building up on the free layer 366 under the shadow. However, the spacer layer 368 would have a uniform thickness along the first portion 360 of the substrate 350 and insulating material 352.

As another magnetic free layer 370 is deposited on the spacer layer 368, the distance between the free layers 366 and 370 is smaller in the second portion 362 than in the first portion 360, thereby increasing the ferromagnetic coupling between the free layers 366 and 370 and enhancing magnetic stability of the structure. A cap layer 372 is then deposited onto the free layer 370 to sandwich the spacer 368 and free 366 and 370 layers.

FIG. 12C further displays examples of operations that may be conducted on the structure of 12B. A milling operation can be facilitated that removes the various layers from the PR material 354 without disturbing the tapered reduction in thickness of the spacer layer 368. The PR material 354 can then be removed through a lift-off procedure that also maintains the tapered reduction in thickness of the spacer layer 368. With a portion of the insulating material 352 exposed, the structure can proceed to be further insulated and shielded or can be fitted with a permanent magnet (PM) 374 separated from the free layers 366 and 370 by a insulating barrier 376. The insulating barrier 376 can be a part of the insulating material 354 or be a separate insulating shape and material that, in some embodiments, is deposited using an atomic layer deposition (ALD) process. The permanent magnet 374 can also be deposited into a variety of shapes with various processes, none of which are required, preferred, or limited.

As can be appreciated, the various layers, layer thickness, and reduction in thickness due to taper can be selectively adjusted to conform to many different configurations that correspond with a variety of magnetic operations. For example, a relatively large tapered reduction in thickness can be present for each layer, or just the non-magnetic spacer 368, without deterring from the spirit of the present invention.

With the structure shown in FIG. 12C, a magnetically sensitive lamination of layers is present that has enhanced stability due to the close proximity of the free layers 366 and 370 along the second portion 362. As such, the amount of ferromagnetic coupling can be adjusted by increasing, or decreasing, the tapered reduction in thickness along the second portion 362 of the structure.

Figure 13:
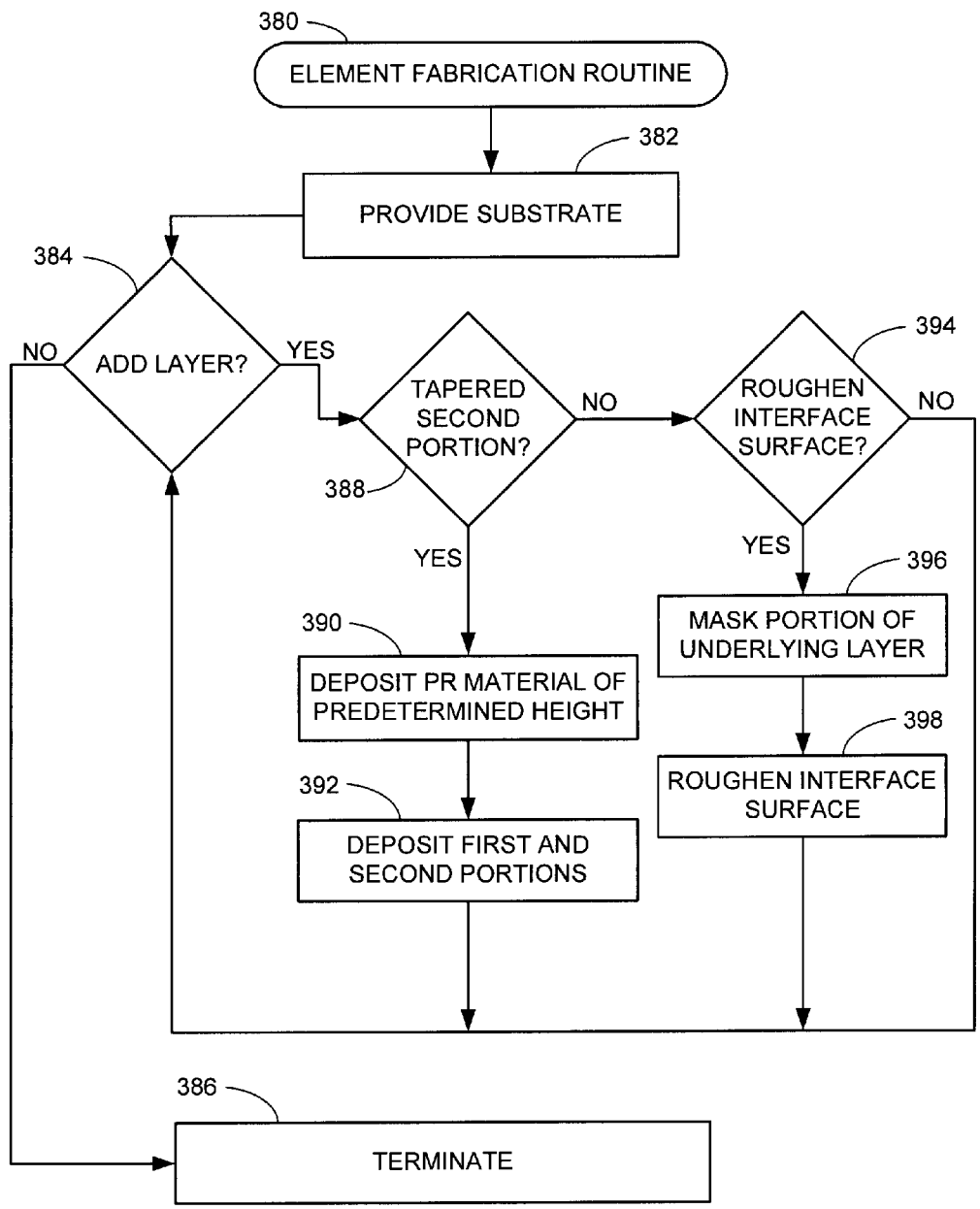
FIG. 13 provides a flow chart of an embodiment of an element fabrication routine performed in accordance with various embodiments of the present invention.

FIG. 13 provides an element fabrication routine 380 performed in accordance with various embodiments of the present invention. The routine 380 begins in step 382 by providing a substrate, which can be a variety of different materials and sizes, such as the shield 150 of FIG. 2 and the insulating material 234 of FIG. 5. A decision 384 is then made concerning if a layer is to be added to the substrate provided in step 382. If no layer is to be added, the routine 380 terminates at step 386 with merely the substrate, in whatever existing form, being constructed However, adding a layer to the substrate is in order, a subsequent decision 388 evaluates if a second portion of the new layer will be tapered. As discussed above, the addition of a tapered reduction in thickness throughout the rear second portion can increase ferromagnetic coupling and improve magnetic sensing of the ABS contacting first portion. Such a tapered reduction is generally illustrated in FIGS. 14A-14C and involves at least the deposition of a photo resist (PR) material of a predetermined height in step 390 that casts a shadow over a portion of the substrate. The shadow is then utilized in step 392 as a new layer of material, such as a seed, non-magnetic spacer, or magnetic free layer, is deposited.

As a result of the shadowing of the PR material in step 392, a portion of the newly deposited layer will have a continuous taper that reduces the thickness of the layer as the layer is in closer proximity to the PR material. With the newly deposited layer, decision 394 is once again evaluated to determine if more layers are called for. On the occasion if the second portion of the new layer is not to be tapered at decision 398, decision 394 determines if some or all of the surface of the substrate or existing layer is to be roughen in a predetermined patterned designed to generate orange-peel coupling.

If roughening of the interface surface between the existing substrate or layer is chosen in decision 394, step 396 masks less than all the substrate or layer which will not be roughened. Next in step 398, the unmasked portion of the substrate or layer is roughened with one or more fabrication techniques discussed in association with FIGS. 11-13C. It should be noted that roughening of the interface surface in step 398 can be done in a single step or a multitude of steps that combine fabrication techniques. Furthermore, steps 396 and 398 are repeated, in some embodiments, to mask a separate portion of the substrate and layer to roughen the interface surface with a predetermined pattern that differs from the initial roughened pattern for the layer.

At the conclusion of step 398, the underlying substrate or layer may have a tapered reduction in thickness in combination with a portion that is roughened to generate orange-peel coupling. With a return to decision 384, additional layers can be deposited and configured to have various ferromagnetic coupling enhancing features, such as tapered region and roughened interface surface, alone or in combination. Likewise, each additional layer can have different sized portions, degrees of roughness, an percent reduction in thickness by consecutively conducting the decisions and steps of the routine 380.

Once the routine 380 is terminated at step 386 with no more layers to be deposited, a magnetically responsive lamination of layers, such as the magnetic stacks of FIGS. 2 and 4-9, can be produced. However, the routine 380 can further include the addition of more layers, such as magnetic shields, like shield 148 of FIG. 2, to complete the fabrication of a magnetic element. As such, the routine 380 is merely an example of a fabrication process which is not limited and in which the various decisions and steps can be modified, moved, or removed. For example, step 390 which deposits PR material on the substrate can be altered to be a decision that evaluates if the PR material is present. Similarly, steps 396 and 398 can be repeated while a step to remove the PR and masking material can be added to the routine 380 before terminating step 386.

It can be appreciated that the configuration and material characteristics of the magnetic element described in the present disclosure allows for enhanced magnetic stability while maintaining a small shield-to-shield spacing. The enhanced ferromagnetic coupling provides improved magnetic performance. Moreover, the increase in ferromagnetic coupling offset from the ABS contacting portion of the element allows for normal operating parameters to be sensed with improved magnetic stability. In addition, while the embodiments have been directed to magnetic sensing, it will be appreciated that the claimed invention can readily be utilized in any number of other applications, including data storage device applications.

It is to be understood that even though numerous characteristics and configurations of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed. For example, the particular elements may vary depending on the particular application without departing from the spirit and scope of the present invention.

What is claimed is:

1. A magnetic element comprising a magnetically responsive lamination of layers with a first portion and a laterally adjacent second portion, the first portion having a first predetermined roughness and the second portion having a second predetermined roughness, the first and second predetermined roughnesses being different and the second portion providing orange-peel coupling to less than an entire interface between at least two layers.

2. The magnetic element of claim 1, wherein the orange-peel coupling corresponds with a first ferromagnetic coupling strength for the second portion that is greater than a second ferromagnetic coupling strength corresponding to the first portion.

3. The magnetic element of claim 1, the lamination of layers is magnetically independent and sensitive to an external magnetic field.

4. The magnetic element of claim 1, wherein the first portion is contactingly adjacent an air bearing surface while the second portion is laterally adjacent a permanent magnet that provides a bias field for the lamination of layers.

5. The magnetic element of claim 1, wherein the lamination of layers has a first and second free layer that are separated by a non-magnetic layer.

6. The magnetic element of claim 1, wherein the lamination of layers are continuous from the first portion to the second portion.

7. The magnetic element of claim 1, wherein the first portion and second portion are separated from an air bearing surface (ABS) by different predetermined distances.

8. The magnetic element of claim 1, wherein each layer of the lamination of layers has a predetermined thickness that is respectively uniform for the first portion.

9. The magnetic element of claim 8, wherein a non-magnetic spacer layer of the lamination of layers tapers to a respective reduced thickness throughout the second portion to orient contacting magnetic free layers in closer proximity than in the first portion.

10. The magnetic element of claim 8, wherein each layer of the lamination of layers has a continuous respective roughness throughout the second portion.

11. The magnetic element of claim 1, wherein the second predetermined roughness is present between each layer of the lamination of layers.

12. A method comprising:
providing a magnetically responsive lamination of layers with a first portion and a laterally adjacent second portion; and
conditioning the first portion to have a first predetermined roughness and the second portion to have a second predetermined roughness that differs from the first predetermined roughness, the second portion providing orange-peel coupling to less than an entire interface between at least two layers.

13. The magnetic element of claim 12, wherein the predetermined roughness is a pattern created by island growth on one or more layers.

14. The magnetic element of claim 12, wherein the predetermined roughness is a pattern created by metal nano-crystal formation on one or more layers.

15. The magnetic element of claim 12, wherein the predetermined roughness is a pattern created by thermally activated de-wetting on one or more layers.

16. The magnetic element of claim 12, wherein the predetermined roughness is a pattern created by glancing angle deposition on one or more layers.

17. The magnetic element of claim 12, wherein the predetermined roughness is a pattern created by glancing angle ion beam etching on one or more layers.

18. The method of claim 12, wherein each layer has a continuous taper from a respective first thickness to a respective second thickness throughout the second portion, the tapered second portion created by depositing a photo resist material of a predetermined height on an insulating material that provides a shadow effect for application of the various layers of the lamination of layers.

19. The method of claim 18, wherein the predetermined height is greater than a length of the lamination of layers.

20. An apparatus comprising:
a magnetically responsive lamination of layers with a first portion and a laterally adjacent second portion, the first portion positioned on an air bearing surface (ABS) and having a first predetermined roughness and the second portion separated from the ABS and having a second predetermined roughness, the first and second predetermined roughnesses being different and the second portion providing orange-peel coupling to less than an entire interface between at least two layers.

21. The apparatus of claim 20, wherein the second portion continuously tapers each layer of the lamination of layers from a respective first thickness of the first portion to a respective second thickness of the second portion.

22. The apparatus of claim 21, wherein the lamination of layers has a seed layer attached on a first side and a cap layer attached to an opposite second side, the cap layer having a greater thickness and taper than the seed layer.

23. The apparatus of claim 20, wherein the second portion is laterally adjacent to and contacts the first portion and is laterally adjacent to and separated from a permanent magnet that applies a bias force to the lamination.

24. The apparatus of claim 20, wherein the second portion has a length that is greater than the first portion.

25. The apparatus of claim 20, wherein the first portion produces no orange-peel coupling.

26. The apparatus of claim 20, wherein the second portion of the magnetically responsive lamination of layers is contactingly adjacent an insulating material that separates the second portion from a magnetic shield.

* * * * *